United States Patent [19]

Khadem et al.

[11] Patent Number: 5,726,859
[45] Date of Patent: Mar. 10, 1998

[54] CIRCUIT BOARD COMPONENT RETAINER AND EXTRACTOR

[75] Inventors: Gita Khadem; George Thomas Holt, both of Austin, Tex.

[73] Assignee: Dell USA, L.P., Round Rock, Tex.

[21] Appl. No.: 507,177

[22] Filed: Jul. 26, 1995

[51] Int. Cl.⁶ .............................. H01M 2/10; H01L 23/32
[52] U.S. Cl. .................... 361/760; 439/73; 429/96; 429/100; 257/727
[58] Field of Search .......................... 361/740, 759, 361/760, 769, 807, 809, 764; 439/70, 71, 73; 429/96, 98, 100; 257/726, 727, 924

[56] References Cited

U.S. PATENT DOCUMENTS

| | | | |
|---|---|---|---|
| 3,335,327 | 8/1967 | Damon et al. | 361/764 |
| 3,885,173 | 5/1975 | Lee | 439/71 |
| 4,252,390 | 2/1981 | Bowling | 439/71 |
| 4,327,953 | 5/1982 | Slagel et al. | 439/71 |
| 4,560,216 | 12/1985 | Egawa | 439/71 |
| 4,692,790 | 9/1987 | Oyamada | 257/727 |
| 5,398,157 | 3/1995 | Paul | 361/740 |

OTHER PUBLICATIONS

Research Disclosure No. 33475, "Pressure Clip"(Disclosed Anonymously), Feb. 1992.

*Primary Examiner*—Michael W. Phillips
*Assistant Examiner*—John B. Vigushin
*Attorney, Agent, or Firm*—Skjerven, Morrill, MacPherson, Franklin & Friel, L.L.P.; Stephen A. Terrile

[57] ABSTRACT

A circuit board has mounted thereon a component package which is secured in place by a retaining device designed to maintain the component package in place and protect it from shock and vibration. The retaining device includes a shortened and strengthened retaining arm which in one position acts to snap on to the component package thereby holding it in place. In a second position the retaining device is removed and repositioned relative to the component package to be utilized in providing a leveraging action to detach the component package from the circuit board.

10 Claims, 3 Drawing Sheets

CIRCUIT BOARD COMPONENT RETAINER AND EXTRACTOR

FIELD OF THE INVENTION

The present invention relates generally to the design of electronic equipment and more particularly to an electronic component housing construction.

BACKGROUND OF THE INVENTION

With the increasing demand for electronic products of all kinds, the construction of such products is becoming more and more critical. This is especially true with regard to products that create much of their market appeal from their small size. Integrated circuits and component packages within electronic products require substantial mounting space and layout planning. With miniaturization, internal compartments and board bays are becoming smaller and smaller. Among other component packages, integrated circuit chips and DC battery packs are taking up even more space within electronic devices.

In many electronic devices, battery packs are mounted on circuit boards and in very tightly confined areas. Further, in order to meet certain ruggedness standards, such battery pack mountings have included a cover or retainer which is designed to tightly hold the batteries in place. Usually the retainer is in addition to a battery mounting system on the circuit board. The component mounting system is arranged to hold the component pack in place even without the retainer.

The component pack cover portion of the retainer needs to be designed to provide added protection against physical damage and movement of the component pack on the circuit board. This requirement is especially challenging in view of the minimal space available on the circuit board. The component retainer cover must be designed to fit snugly around the component pack without extending substantially beyond the small space required for the component pack itself. This space limitation mandates that the component pack cover or retainer be constructed of a thin material which weighs the least and takes up only minimal board space, since there is normally no specific requirement that the retainer be inflexible or rigid, and a thin pliable material will extend less into the circuit board area surrounding the retained component package.

Other design constraints however, must also be considered. The component retainer must be designed to be easily placed and locked into position to hold the component pack on the circuit board, prevent its movement under shock and vibration, and take up only minimal space surrounding the mounted component pack so that the mounted component maintains as low a profile as possible. With the space related design priority for the circuit board, the mounting device which is on the circuit board and designed to attach the component pack to the board, has been modified to provide an even stronger attachment to the mounted component pack to allow the retainer or component cover to be constructed of a thinner material.

However, in field servicing the mounted component package, it is sometimes necessary to remove the component pack and either replace it or re-install it. That operation in the past has required the use of a special tool to pry the component, for example an IC chip or a battery pack, free of the attaching device on the circuit board. This has created the need for the service personnel to carry an additional tool in order to accomplish a component check or replacement. The component extraction tool needs to have special characteristics because of the need to be able to extract the component pack without damaging any of the other components and IC packages which are mounted on the circuit board closely adjacent to each other. Thus there is a need for an improved electronic component retainer design, which provides a sturdy yet compact cover for housing electrical components, and a base mounting arrangement for providing a strong attachment to the component being housed by the cover, and a means for easily extracting the component from the base mounting arrangement, without the need for additional special tooling.

SUMMARY OF THE INVENTION

It is therefore an object of the present invention to provide an improved retainer construction for retaining electronic components in position on a circuit board, wherein the retainer construction is also useful as a tool in detaching the electronic component from the board.

In one embodiment of the present invention there is provided a circuit board arranged for having component packages detachably mounted thereon, the circuit board comprising a board mounting means arranged on the circuit board to be selectively engagable with a component package to effectively mount the component package on the circuit board, and a retaining means arranged to be coupled to the circuit board for retaining the component package in a predetermined position on the board, wherein the retaining means also includes a detaching device for selectively detaching the component package from said board mounting means on the circuit board.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION

Although the present invention will be explained in connection with the preferred embodiment as applicable to a computer system, it will be understood that the principles of the present invention are equally applicable to any electronic device where it is desirable to mount component packages of the system in a small congested area having limited space. Although the present example is explained using a battery pack as a component package, the component package may also be an integrated circuit chip package or chip which may be detachably mounted to a circuit board, and subsequently selectively detached for upgrading or replacement.

In all of the Figures, like numerals refer to like parts although not all of the like parts are numbered in all of the drawings in order to more clearly show all of the featured parts and mechanical characteristics of those parts as implemented in the exemplary embodiment of the present invention as disclosed herein.

Figure 1:
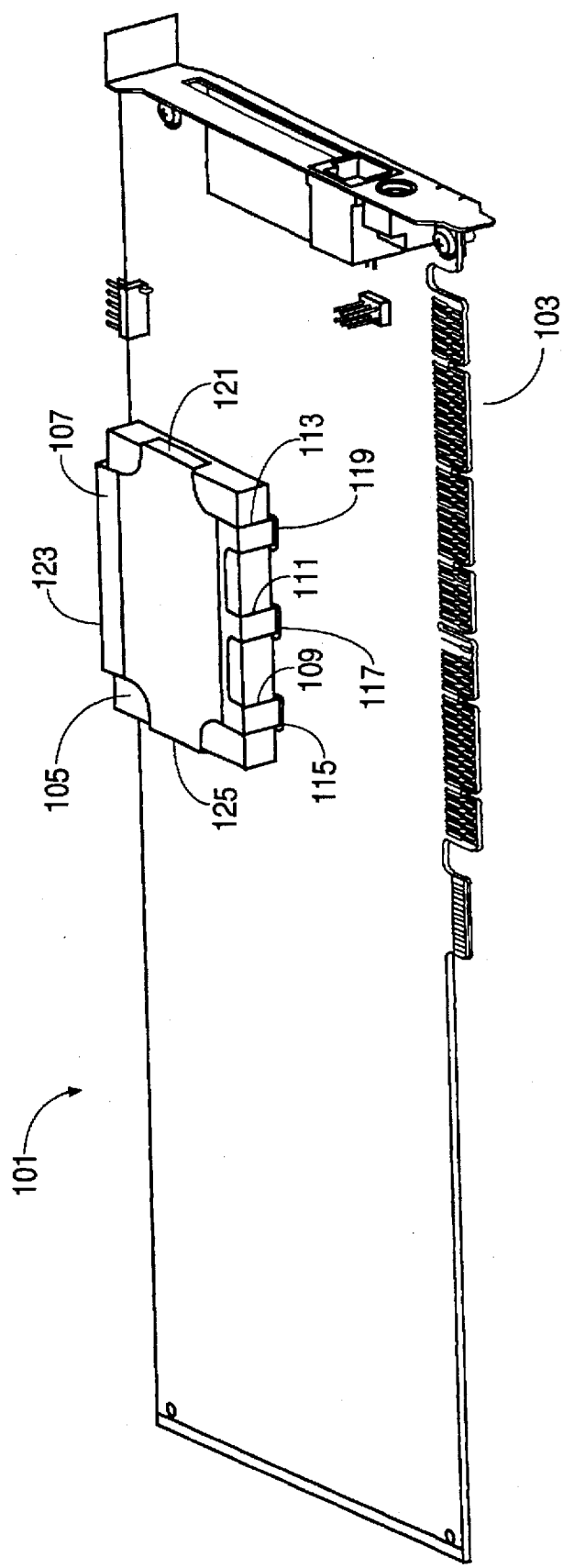
FIG. 1 is a perspective view of a circuit board showing the retainer apparatus of the present invention.

Referring now to FIG. 1 in detail, there is shown a circuit board 101. The board 101 includes a connector strip area 103 which is designed to provide electrical connections to a motherboard of a personal computer (PC) in the present example. Mounted on the board 101 is a battery pack 105. The battery pack 105 is attached to the board 101 through various kinds of attaching means and devices. For example, such attaching means may be comprised of standard pin-through hole sockets which may be soldered to the circuit board. There are many and various ways and means of attaching a battery or a battery pack to a circuit board and such means are well known in the art. For purposes of explanation in connection with the present invention, it is noted that any of the many attaching means or devices may be used so long as the battery or battery pack is both electrically and mechanically connected to the board and that the battery or battery pack is firmly affixed to the board. The details of the battery attaching device are not required to be of any specific design and are not necessary to disclose in detail in order to understand the implementation of the present invention. It is sufficient to note that the battery pack 105 is firmly mounted on the circuit board 101 in a relatively secure manner so that the battery pack may not be removed by hand, but rather, in order to remove the battery pack 105, a prying or levered separating action is required to be asserted between the pack 105 and the board 101, using an appropriate prying tool.

FIG. 1 also shows a battery retainer or cover 107. The retainer 107 is constructed of a light weight material and includes, in the present example, first and second locking devices for securing the retainer 107 to the board 101. As shown, the first locking device includes three board clamping arms 109, 111 and 113, which are designed to snap into the board receptacles 115, 117 and 119, respectively, holding the battery pack 105 or other component housing device therebetween. On the sides adjacent to the side of the retainer that includes the clamping arms 109, 111 and 113, there are battery pack clamping arms 121 and 125 which are designed to snap around the edges of the battery pack 105 and hold the pack 105 firmly in place. On the opposite side of the retainer 107 is another board locking device which, in the present example includes an extension 123. Retainer extension 123 includes a clamping edge along the bottom of the extension which is designed to snap over the edge of the circuit board 101. In the embodiment shown in FIG. 1, the battery pack 105 and the retainer 107 are in the normal operating positions within an electronic device where the pack 105 is attached to the circuit board 101 and also retained in place by the retainer or cover 107.

Figure 2:
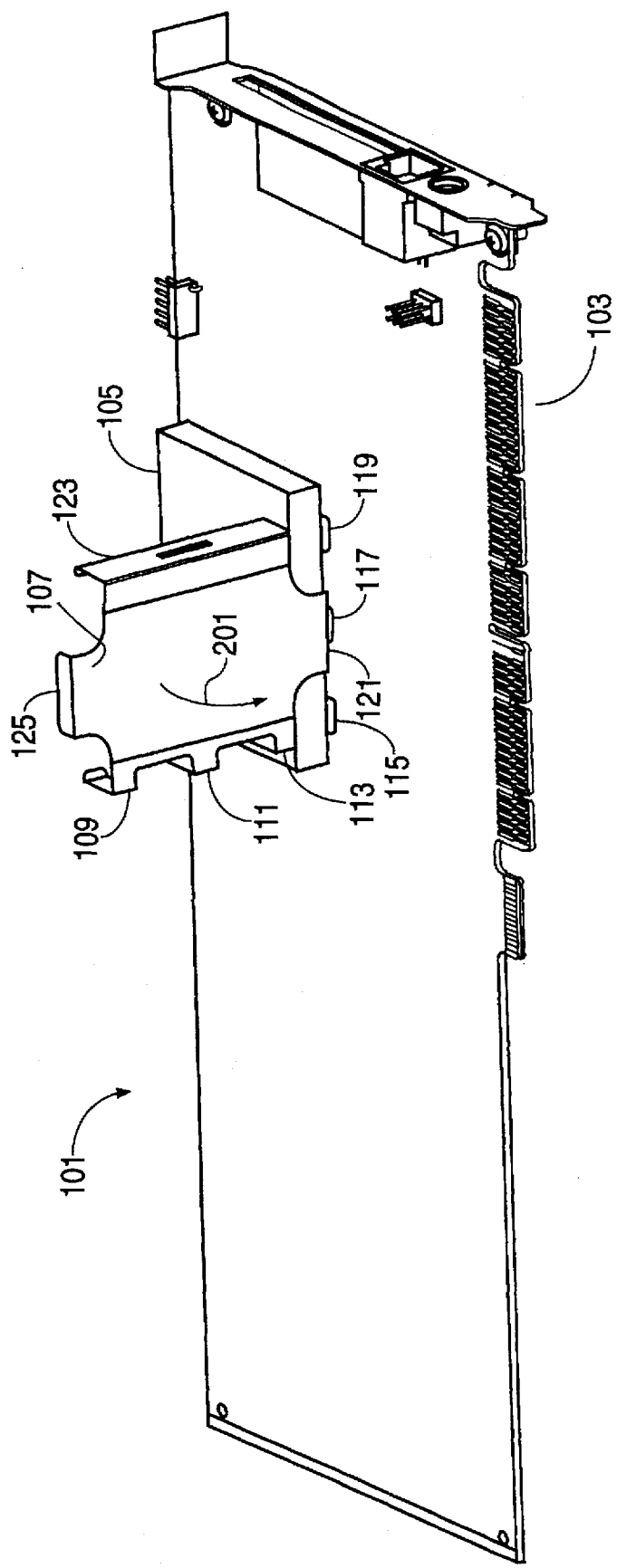
FIG. 2 is another perspective view showing the retainer in an extracting mode.

FIG. 2 shows the retainer 107 having been removed from its normal position by manually flexing the clamp 123 for example, and unclipping the retainer 107 from the battery pack and the locking receptacles 115, 117 and 119 of the circuit board 101. The retainer 107 is rotated 90 degrees clockwise from its orientation in FIG. 1 so that the clamping arm 121 can be inserted between the battery pack 105 and the circuit board 101 and used as a lever to pry the battery pack 105 away from the circuit board 101. That is accomplished by sliding the clamping arm 121 underneath of the battery pack 105 and, by using the board 101 itself as a support, rotating the retainer 107 in the direction 201 shown in FIG. 2. The clamping arm 121 is designed to be shorter than normal so as to provide the needed extra strength to be used as a lever or prying tool in addition to its function in securing the battery pack 105 in place. Accordingly, the battery pack 105 may be removed very easily by using the retainer 107 and no extra tooling is required. The clamping arm 121 is also required to be relatively short in order to be able to be placed under the battery pack 105 on the board 101 without damaging components which would be mounted closely adjacent to the battery pack 105 on the board 101. Such components are not shown in the Figures so as not to unnecessarily obfuscate the details of the retainer 107 of the present invention.

Figure 3:
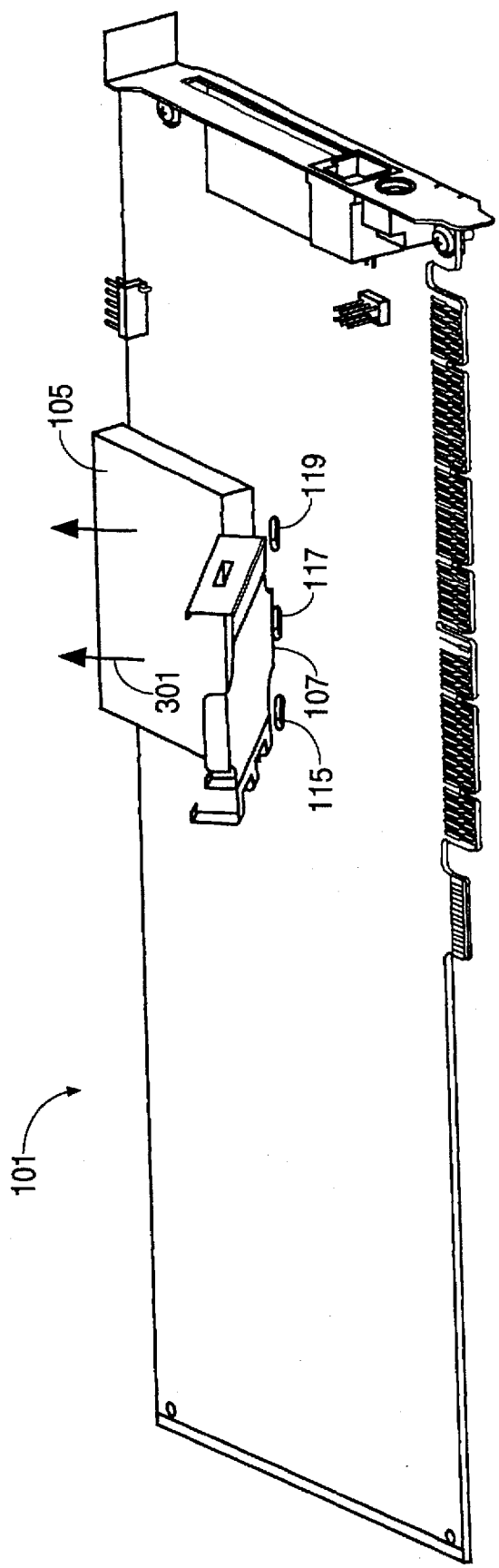
FIG. 3 is a perspective view of the circuit board illustrated the extraction of a battery pack.

As shown in FIG. 3, by using the retainer 107 as an extraction tool, the battery pack 105 is readily moved in an upwardly direction 301 and is thereby detached from its mounting on the circuit board 101.

The apparatus of the present invention has been described in connection with the preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention as defined by the following claims.

What is claimed is:

1. A circuit board arranged for having component packages detachably mounted thereon, said circuit board comprising:

a board mounting means arranged on said circuit board, said board mounting means being engagable with a component package to detachably mount the component package on said circuit board; and a retaining means arranged to be coupled to said circuit board, said retaining means being configured to retain the component package in a predetermined position with respect to said retaining means, said retaining means being further removably engagable with said circuit board to retain the component package in place on said board mounting means, said retaining means further including a detaching device, said detaching device being operable to detach said component package from said board mounting means.

2. The invention as set forth in claim 1 wherein said detaching device comprises a section of said retaining means, said retaining means when disengaged from said circuit board, being operable to detach the component package from said board mounting means.

3. The invention as set forth in claim 1 wherein said retaining means comprises a one-piece housing, said housing being configured to house the component package and retain the component package between said retaining means and said circuit board.

4. The invention as set forth in claim 3 wherein said housing includes a top surface and locking arms configured to extend from said top surface, said retaining means further including board receptacles within said circuit board, said board receptacles being arranged to receive said locking arms to hold the component package between said top surface of said housing and said circuit board.

5. The invention as set forth in claim 1 wherein the component package comprises an integrated circuit chip package.

6. The invention as set forth in claim 1 wherein the component package comprises a battery package.

7. A circuit board arranged for having component packages detachably mounted thereon, the circuit board comprising:

a board mounting means arranged on the circuit board, the board mounting means being engagable with a component package to detachably mount the component package on the circuit board; and a retaining means arranged to be coupled to the circuit board, the retaining means being configured to retain the component package in a predetermined position with respect to the retaining means, the retaining means being further removably engagable with the circuit board to retain the component package in place on the board mounting means, the retaining means further comprising:

a detaching device operable to detach the component package from the board mounting means;

a one-piece housing configured to house the component package and retain the component package between the retaining means and the circuit board, the housing including a top surface and locking arms configured to extend from the top surface; and board receptacles within the circuit board and arranged to receive the locking arms to hold the component package between the top surface of the housing and the circuit board;

the locking arms are spring biased to clip into the board receptacles, the housing being removable from engagement with the board receptacles, the detaching device comprising a section of the housing, the section being configured to be placed between the component package and the board mounting means, the section being operable to detach the component package from the board mounting means.

8. The invention as set forth in claim 7 wherein the section comprises a shortened perpendicularly extended arm from the top surface of the housing, the shortened perpendicularly extended arm being selectively placed between the component package and the board mounting means to selectively apply a leveraging force to the component package relative to the circuit board.

9. A computer system comprising:

a processor;

a memory coupled to the processor; and a circuit board coupled to the processor and arranged for having component packages detachably mounted thereon, the circuit board further comprising:

a board mounting means arranged on the circuit board, the board mounting means being engagable with a component package to detachably mount the component package on the circuit board; and a retaining means arranged to be coupled to the circuit board, the retaining means being configured to retain the component package in a predetermined position with respect to the retaining means, the retaining means being further removably engagable with the circuit board to retain the component package in place on the board mounting means, the retaining means further comprising:

a detaching device operable to detach the component package from the board mounting means;

a one-piece housing configured to house the component package and retain the component package between the retaining means and the circuit board, the housing including a top surface and locking arms configured to extend from the top surface; and board receptacles within the circuit board and arranged to receive the locking arms to hold the component package between the top surface of the housing and the circuit board;

the locking arms are spring biased to clip into the board receptacles, the housing being removable from engagement with the board receptacles, the detaching device comprising a section of the housing, the section being configured to be placed between the component package and the board mounting means, the section being operable to detach the component package from the board mounting means.

10. The computer system of claim 9 wherein the section comprises a shortened perpendicularly extended arm from the top surface of the housing, the shortened perpendicularly extended arm being selectively placed between the component package and the board mounting means to selectively apply a leveraging force to the component package relative to the circuit board.

* * * * *